United States Patent
Anderson et al.

(10) Patent No.: US 9,443,857 B2
(45) Date of Patent: Sep. 13, 2016

(54) VERTICAL FIN EDRAM

(71) Applicant: GlobalFoundries Inc., Grand Cayman (KY)

(72) Inventors: Brent A. Anderson, Jericho, VT (US); John E. Barth, Jr., Williston, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 96 days.

(21) Appl. No.: 14/561,999

(22) Filed: Dec. 5, 2014

(65) Prior Publication Data

US 2016/0163712 A1    Jun. 9, 2016

(51) Int. Cl.
| | |
|---|---|
| H01L 27/108 | (2006.01) |
| H01L 29/00 | (2006.01) |
| H01L 31/036 | (2006.01) |
| H01L 31/112 | (2006.01) |
| H01L 27/12 | (2006.01) |
| H01L 21/02 | (2006.01) |
| H01L 21/306 | (2006.01) |
| H01L 21/768 | (2006.01) |

(52) U.S. Cl.
CPC ... *H01L 27/10829* (2013.01); *H01L 21/02532* (2013.01); *H01L 21/02595* (2013.01); *H01L 21/02598* (2013.01); *H01L 21/02636* (2013.01); *H01L 21/30604* (2013.01); *H01L 21/7684* (2013.01); *H01L 21/76831* (2013.01); *H01L 21/76877* (2013.01); *H01L 27/1087* (2013.01); *H01L 27/10826* (2013.01); *H01L 27/10879* (2013.01); *H01L 27/10885* (2013.01); *H01L 27/1203* (2013.01)

(58) Field of Classification Search
USPC ............... 257/68, 71, 301; 438/243, 386
See application file for complete search history.

(56) References Cited

U.S. PATENT DOCUMENTS

| | | | | |
|---|---|---|---|---|
| 4,801,988 | A * | 1/1989 | Kenney | H01L 27/10829 257/304 |
| 5,008,214 | A | 4/1991 | Redwine | |
| 5,214,603 | A * | 5/1993 | Dhong | H01L 27/10832 257/E27.093 |
| 5,529,944 | A | 6/1996 | Rajeevakumar | |
| 6,184,549 | B1 | 2/2001 | Furukawa et al. | |
| 6,252,267 | B1 | 6/2001 | Noble, Jr. | |
| 6,680,237 | B2 | 1/2004 | Chen et al. | |
| 6,881,620 | B1 | 4/2005 | Lai et al. | |
| 7,223,678 | B2 | 5/2007 | Noble et al. | |
| 7,439,135 | B2 * | 10/2008 | Cheng | H01L 21/84 257/E21.112 |
| 7,485,909 | B2 | 2/2009 | Matsumoto et al. | |
| 8,519,462 | B2 | 8/2013 | Wang et al. | |
| 2013/0126985 | A1 | 5/2013 | Cheng et al. | |

* cited by examiner

*Primary Examiner* — Errol Fernandes
(74) *Attorney, Agent, or Firm* — Gibb & Riley, LLC; Michael J. LeStrange, Esq.

(57) ABSTRACT

Systems and methods of forming semiconductor devices. A trench capacitor comprising deep trenches is formed in an n+ type substrate. The deep trenches have a lower portion partially filled with a trench conductor surrounded by a storage dielectric. A polysilicon growth is formed in an upper portion of the deep trenches. The semiconductor device includes a single-crystal semiconductor having an angled seam separating a portion of the polysilicon growth from an exposed edge of the deep trenches. A word-line is wrapped around the single-crystal semiconductor. A bit-line overlays the single-crystal semiconductor.

14 Claims, 16 Drawing Sheets

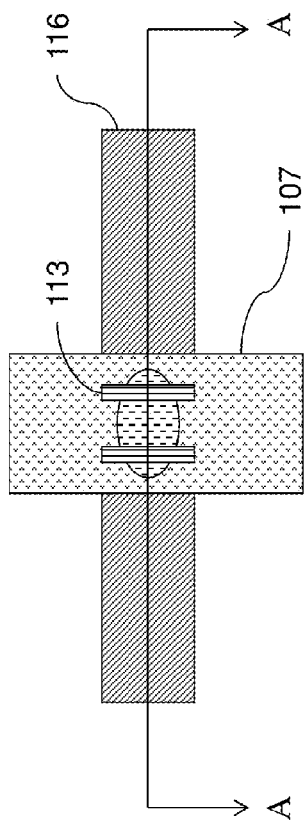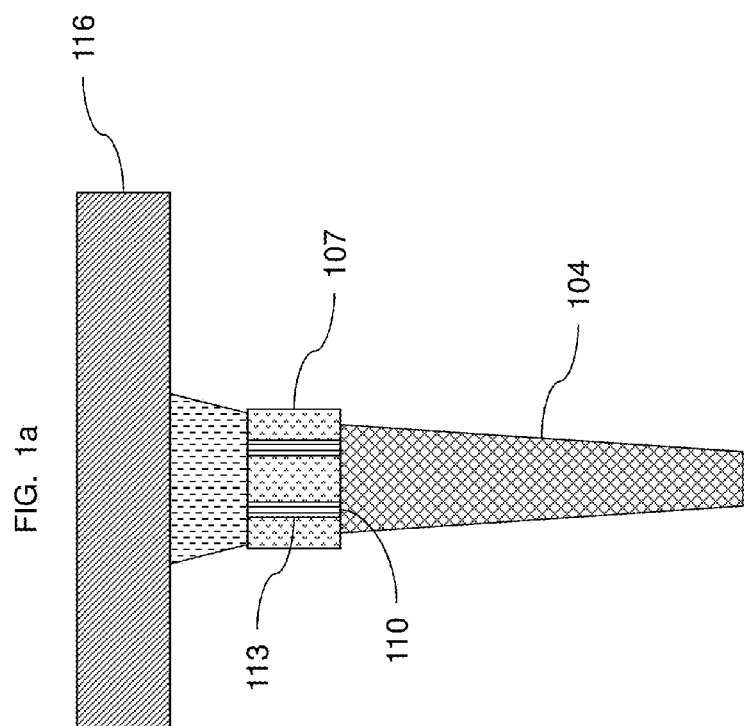

VERTICAL FIN EDRAM

BACKGROUND

The present disclosure relates to semiconductors and, more particularly, to structures and methods for forming embedded dynamic random access memory (eDRAM) cells.

Electronic systems typically store data during operation in a memory device. In recent years, the dynamic random access memory (DRAM) has become a popular data storage device for such systems. A DRAM is an integrated circuit that stores data in binary form (e.g., "1" or "0") in a large number of cells. The data is stored in a cell as a charge on a capacitor located within the cell.

The cells of a conventional DRAM are arranged in an array so that individual cells can be addressed and accessed. Each row of the array includes a word-line that interconnects cells on the row with a common control signal. Similarly, each column of the array includes a bit-line that is coupled to a cell in each row. Thus, the word-lines and bit-lines can be controlled to individually access each cell of the array.

As dynamic random access memory (DRAM) cells are scaled to meet chip-size requirements for future generations, the channel length of transfer devices on the surface of the silicon substrate can no longer be scaled without degrading subthreshold leakage requirements (or retention time requirements). Process steps become complex and incompatible with standard DRAM processes, when vertical transfer devices in the DRAM cell are employed to decouple the channel length from layout ground rules.

SUMMARY

According to exemplary semiconductor devices described herein, a trench capacitor comprising deep trenches is formed in an n+ type substrate. The deep trenches have a lower portion partially filled with a trench conductor surrounded by a storage dielectric. A polysilicon growth is formed in an upper portion of the deep trenches. The semiconductor device includes a single-crystal semiconductor having an angled seam separating a portion of the polysilicon growth from an exposed edge of the deep trenches. A word-line is wrapped around the single-crystal semiconductor. A bit-line overlays the single-crystal semiconductor.

According to an exemplary semiconductor device a substrate comprises a silicon layer, a buried oxide (BOX) layer, and a silicon on oxide (SOI) layer. The BOX layer is between the silicon layer and the SOI layer. A trench capacitor has deep trenches through the BOX layer and the SOI layer and partially into the silicon layer. The deep trenches have a lower portion partially filled with a trench conductor surrounded by a storage dielectric. The trench conductor extends into the BOX layer. A polysilicon growth extends from the trench conductor in an upper portion of the deep trenches. A single-crystal semiconductor extends from an exposed edge of the SOI layer. A seam separates a portion of the polysilicon growth from the exposed edge of the SOI layer.

According to an exemplary method herein, a structure comprising a multi-layer wafer is provided. Trenches are formed in the structure. Lower portions of the trenches are filled with conductive material. A portion of layers between the trenches is removed leaving exposed edges in the multi-layer wafer. A polysilicon growth is formed on the conductive material, in upper portions of the trenches. A single-crystal semiconductor is created using a selective silicon growth process from the exposed edges. The selective silicon growth process forms an angled seam separating a portion of the polysilicon growth and the exposed edges of the trenches. Fins are formed in the single-crystal semiconductor. Gate stacks are formed around the fins. The gate stacks comprise word-line conductor material. Nodes are formed on the fins. An oxide layer is deposited on the multi-layer wafer leaving a surface of the nodes exposed. A bit-line is formed on the oxide layer. The bit-line contacts the nodes.

According to an exemplary method of forming a semiconductor device, a trench is formed in a substrate. The substrate comprises a silicon layer, a buried oxide (BOX) layer, and a silicon on oxide (SOI) layer. A trench capacitor is formed in the trench. The trench capacitor comprises a trench conductor extending into the BOX layer. A polysilicon growth is formed on the trench conductor, in an upper portion of the trench. A single-crystal semiconductor is selectively grown from an exposed edge of the SOI layer, forming an angled seam between the polysilicon growth and the single-crystal semiconductor. The angled seam separates a portion of the trench conductor and an exposed edge of the SOI layer. Fins are patterned in the single-crystal semiconductor. The patterning removes the SOI layer. A first insulator layer is deposited on the substrate exposing a first portion of the fins. Word-line conductor material is deposited on the first insulator layer exposing a second portion of the fins. The second portion is relatively smaller than the first portion. A second insulator layer is deposited on the word-line conductor material leaving an end portion of the fins exposed. A selective epitaxial growth process is performed to form nodes on the end portion of the fins. Gate stacks are patterned around the nodes and fins. The gate stacks comprise the word-line conductor material. The patterning removes unmasked portions of the word-line conductor material and unmasked portions of the second insulator layer. An oxide layer is deposited on exposed portions of the first insulator layer leaving a surface of the nodes exposed. A bit-line is formed on the oxide layer. The bit-line contacts the nodes.

According to another example, a non-transitory computer readable storage medium readable by a computerized device is disclosed. The non-transitory computer readable storage medium stores instructions executable by the computerized device to perform a method of forming a semiconductor device. According to the method, a structure is provided. The structure comprises a multi-layer wafer. Trenches are formed in the structure. Lower portions of the trenches are filled with conductive material. A portion of layers between the trenches is removed leaving exposed edges in the multi-layer wafer. A polysilicon growth is formed on the conductive material, in upper portions of the trenches. A single-crystal semiconductor is created using a selective silicon growth process from the exposed edges. The selective silicon growth process forms an angled seam separating a portion of the polysilicon growth and the exposed edges of the trenches. Fins are formed in the single-crystal semiconductor. Gate stacks are formed around the fins. The gate stacks comprise word-line conductor material. Nodes are formed on the fins. An oxide layer is deposited on the multi-layer wafer leaving a surface of the nodes exposed. A bit-line is formed on the oxide layer. The bit-line contacts the nodes.

BRIEF DESCRIPTION OF THE DRAWINGS

The foregoing and other exemplary purposes, aspects, and advantages will be better understood from the following detailed description of exemplary systems and methods herein with reference to the drawings, in which:

FIGS. 1a and 1b illustrate a high-level overview of a four feature DRAM trench fin cell according to systems and methods herein;

DETAILED DESCRIPTION

Figure 2:
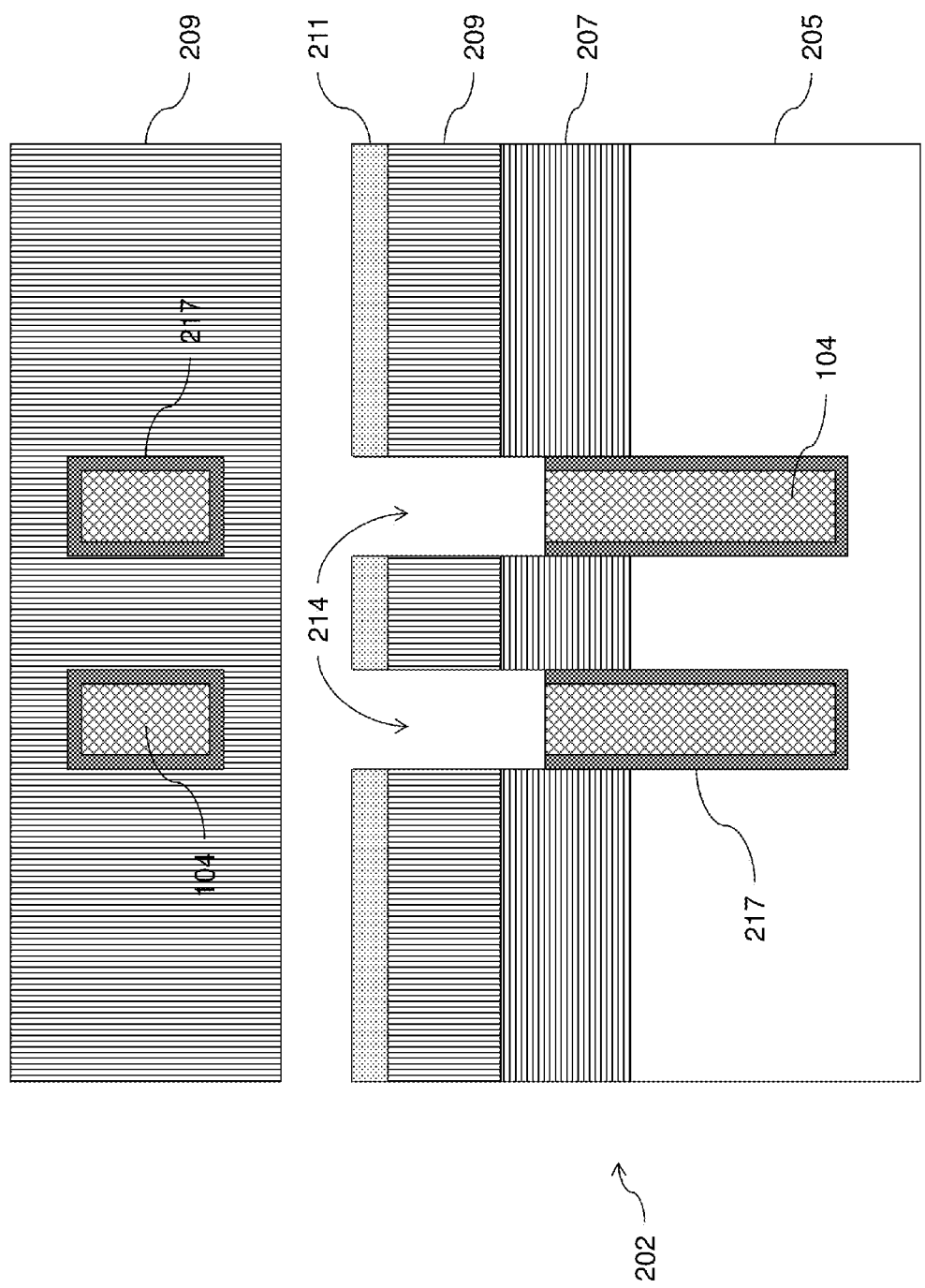
FIGS. 2-13 are schematic diagrams of a sectional view of semiconductor structure in fabricating a DRAM structure according to systems and methods herein.

Referring now to the drawings, there are shown exemplary illustrations of the structures of a four-feature, square DRAM Trench Fin Cell in a semiconductor wafer and method of forming such structure.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

FIG. 1a illustrates a top plan view of a high-level overview of a semiconductor device, indicated generally as 101, according to systems and methods herein. FIG. 1b illustrates a cross section view of the same structure, taken along line 'A-A' of FIG. 1a. The semiconductor device 101 may comprise a four-feature, square DRAM Trench Fin Cell that includes a trench capacitor comprising deep trenches formed in an n+ type substrate. The deep trenches have a lower portion partially filled with a trench conductor 104 surrounded by a storage dielectric liner. A polysilicon growth 107 is included in an upper portion of the deep trenches. The semiconductor device 101 includes a single-crystal semiconductor 110 having an angled seam between the single-crystal semiconductor 110 and the polysilicon growth 107. The single-crystal semiconductor 110 is patterned into fins 113. The polysilicon growth 107 may constitute a word-line wrapped around the single-crystal semiconductor 110. A bit-line 116 overlays the channel semiconductor 110.

As shown in FIG. 2, a multi-layer wafer, indicated generally as 202, may include a silicon layer 205, a buried oxide (BOX) layer 207, and a silicon on oxide (SOI) layer 209. Other layers, such as a pad film 211, may be included over the SOI layer 209. The silicon layer 205 may include an N+ doped region.

According to structures and methods herein, some layers may be lightly doped with a p-type impurity species, such as boron, to render it p-type in which holes are the majority carriers and dominate the electrical conductivity of the constituent semiconductor material. Some layers may be lightly doped with an n-type impurity species, such as arsenic to render it n-type in which electrons are the majority carriers and dominate the electrical conductivity of the semiconductor material.

The multi-layer wafer 202 includes trenches 214. The trenches 214 have a lower portion partially filled with a trench conductor 104, which may comprise doped polysilicon, or a liner stack of electrical conductors, such as TiN, TiC, with a doped polysilicon fill, surrounded by a storage dielectric liner 217. In practice, the trenches 214 may be etched into the multi-layer wafer 202 using any appropriate etching process. For example, a subtractive etching process, such as a reactive-ion etching (RIE) process or a wet chemical etching process, can be used to remove regions of the BOX layer 207, the SOI layer 209, and the pad film 211 not protected by a mask layer. After the trenches 214 have been etched, the open regions of the trenches are filled with a trench conductor 104 and then planarized. The storage dielectric liner 217 and trench conductor 104 are then etched back to within the BOX layer 207.

Figure 3:
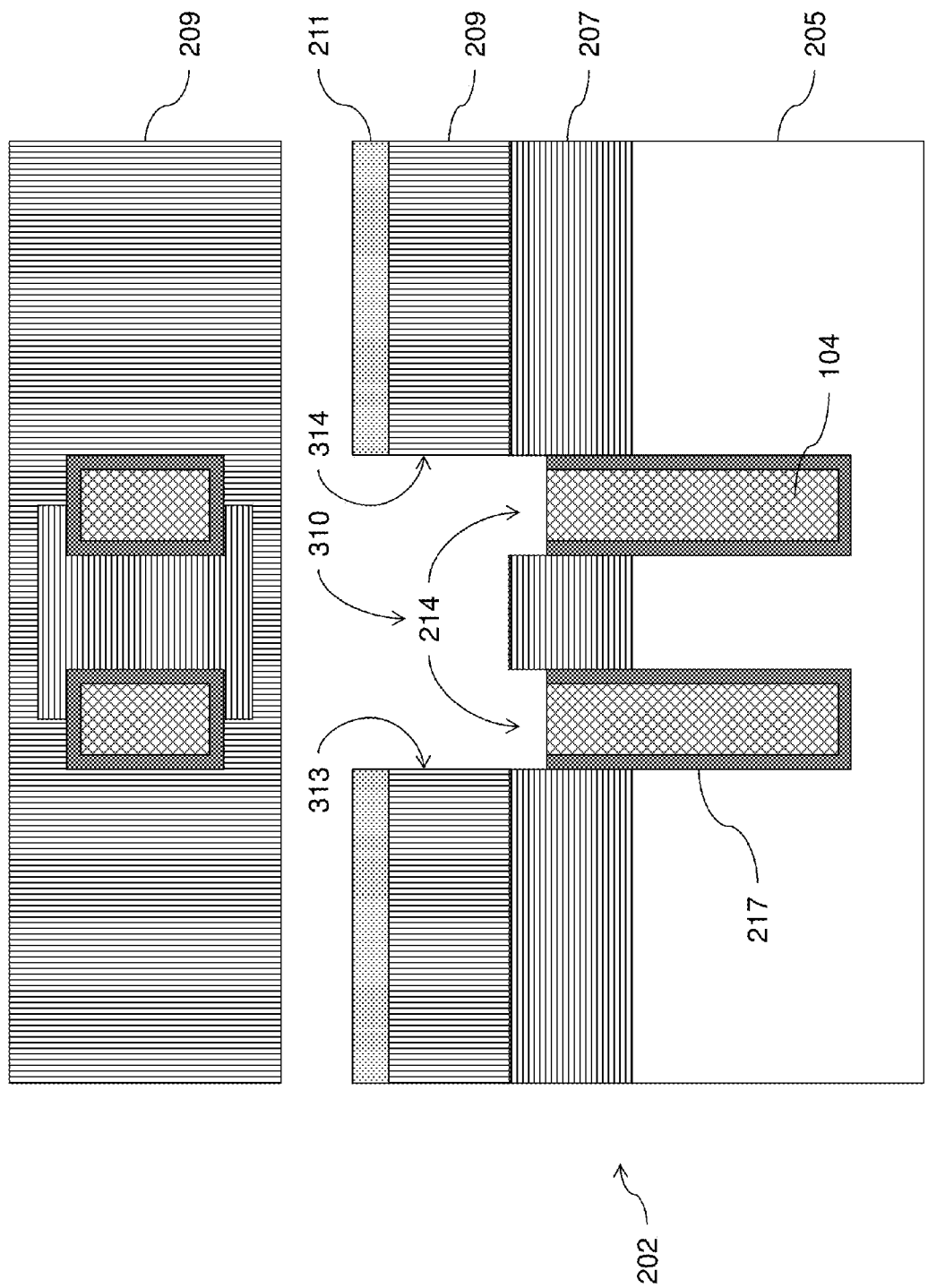

As shown in FIG. 3, a pattern may be formed around the trenches and an appropriate process may be used to remove a portion of the SOI layer 209 between the trenches 214, forming an opening 310 and leaving exposed edges 313, 314 of the SOI layer 209.

Figure 4:
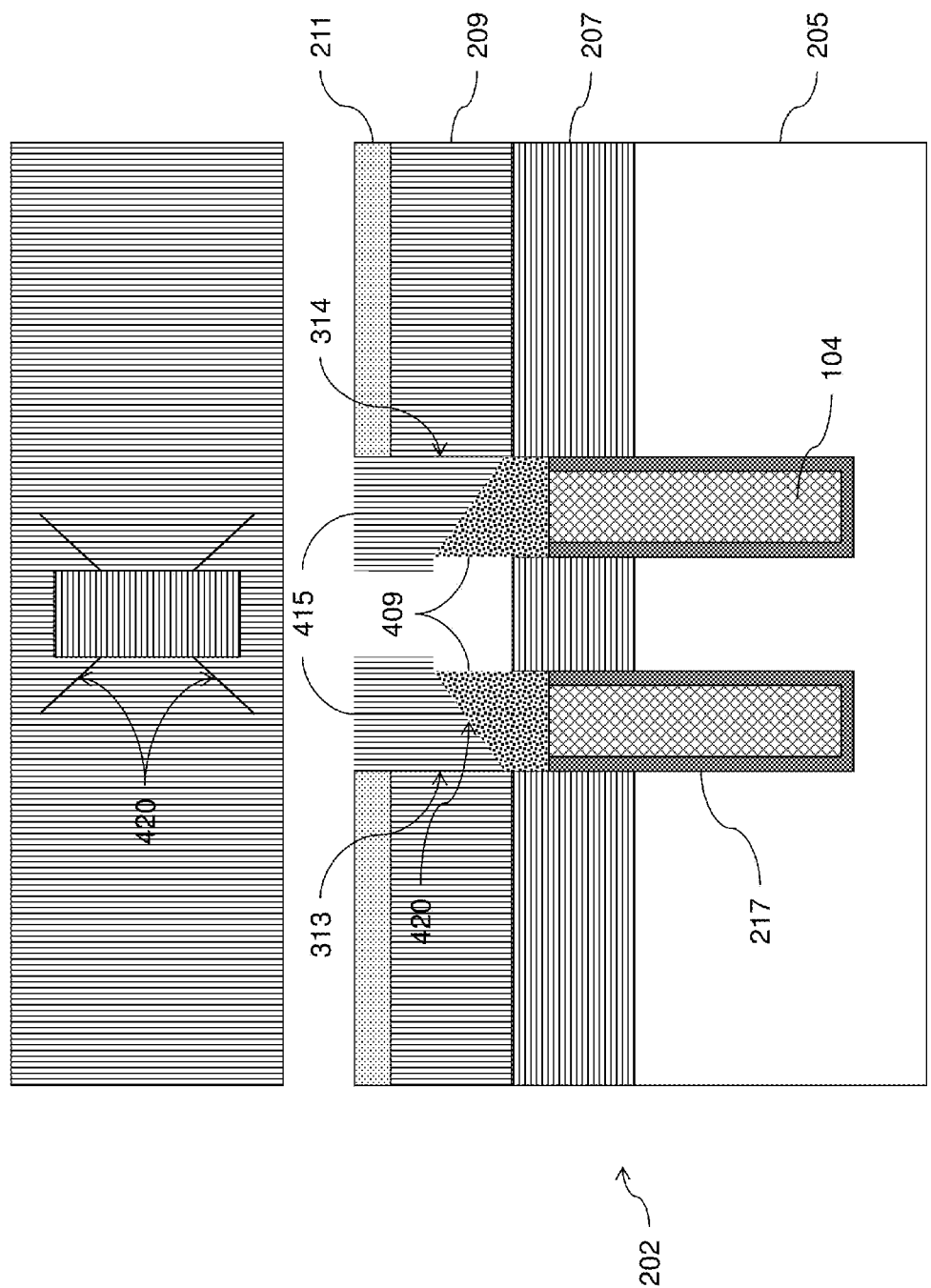

As shown in FIG. 4, a polysilicon growth 409 is formed in an upper portion of the trenches 214. Simultaneously, semiconductor growth is formed on the exposed edges 313, 314 to create a single-crystal semiconductor 415. The selective semiconductor growth grows from the exposed edges 313, 314 of the SOI layer 209 to meet the polysilicon growth 409 growing from the top of the trench conductor 104. As the polysilicon growth 409 grows upward from the trench conductor 104 and the semiconductor growth simultaneously grows inward from the exposed edges 313, 314, a seam 420 is formed where the single-crystal semiconductor 415 meets the polysilicon growth 409 and is the location where the two different materials (polysilicon growth 409 and single-crystal semiconductor 415) meet (the physical location where the polysilicon 409 physically contacts the semiconductor 415). The single-crystal semiconductor 415 separates a portion of the polysilicon growth 409 and the exposed edges 313, 314 of the SOI layer 209.

Since the polysilicon growth 409 is growing at the same time as the single-crystal semiconductor 415, the seam 420 between them is formed at an acute angle between the exposed edges 313, 314 of the SOI layer 209 and a horizontal surface of the BOX layer 207. In other words, the physical boundary between the silicon layer 205 and the BOX layer 207 (e.g., the "top" of silicon layer 205 and the "bottom" of BOX layer 207) lies in a plane and the seam 420 is at an angle that is not parallel to, or perpendicular to, that plane. Thus, the seam 420 is at an angle relative to the plane formed where the surfaces of the silicon layer 205 and the BOX layer 207 meet, and such an angle is other than parallel to (i.e., other than at 0° relative to) and other than perpendicular to (i.e., other than at 90° relative to) the plane formed at the meeting of the surfaces of the silicon layer 205 and the BOX layer 207. Further, this angle is different from even approximately parallel or perpendicular to such a plane, and the angle of the seam 420 can be, for example, 20°-70° (e.g., 30°, 45°, 60°, etc.) relative to the plane formed at the meeting of the surfaces.

Figure 5:
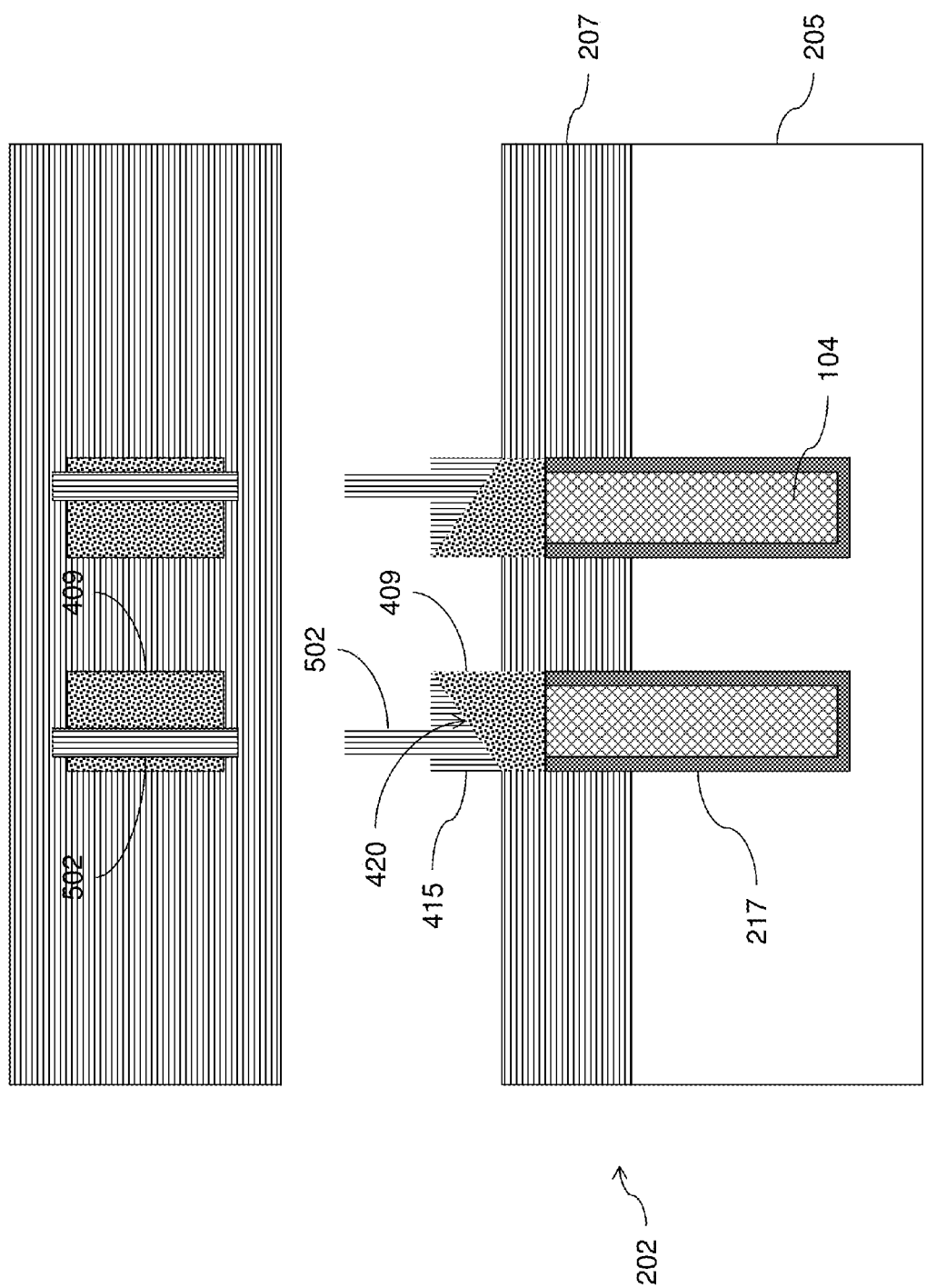

In FIG. 5, fins 502 are formed in the single-crystal semiconductor 415. The fins 502 may be formed using a mandrel and cut masks. As shown in FIG. 5, the SOI layer 209 and the pad film 211 are removed from places where they are not covered by masking materials.

Figure 6:
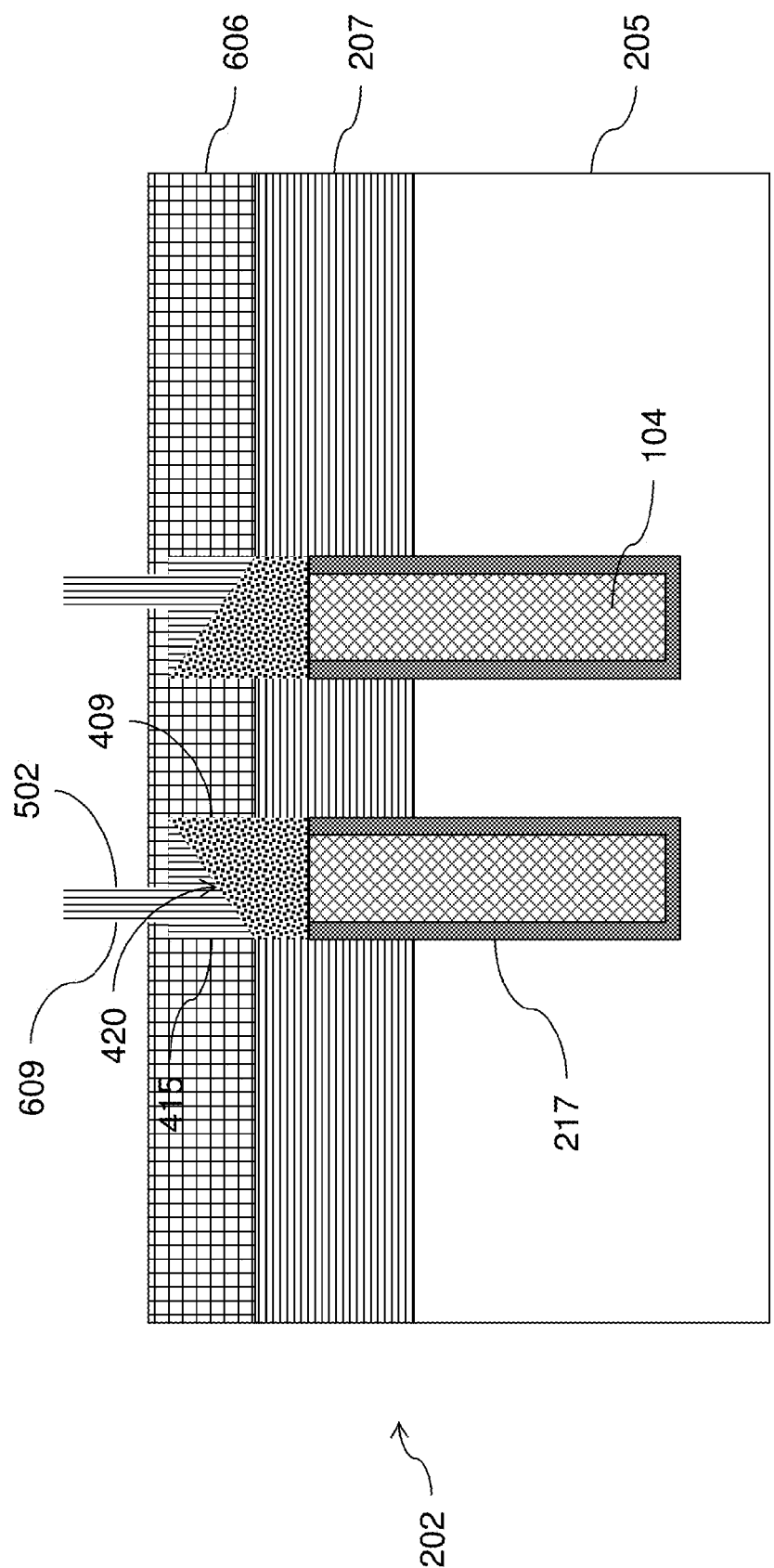

In FIG. 6, a first insulator layer 606 is deposited on the top surface of BOX layer 207. The first insulator layer 606 is planarized and etched back to expose a first portion 609 of the fins 502.

For purposes herein, an "insulator" is a relative term that means a material or structure that allows no (many orders of magnitude difference) electrical current to flow than does a "conductor." The dielectrics (insulators) mentioned herein can, for example, be formed by plasma deposition of $SiO_2$ or $SiO_2$-based materials by reacting either tetra-ethyl-orthosilane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Figure 7:
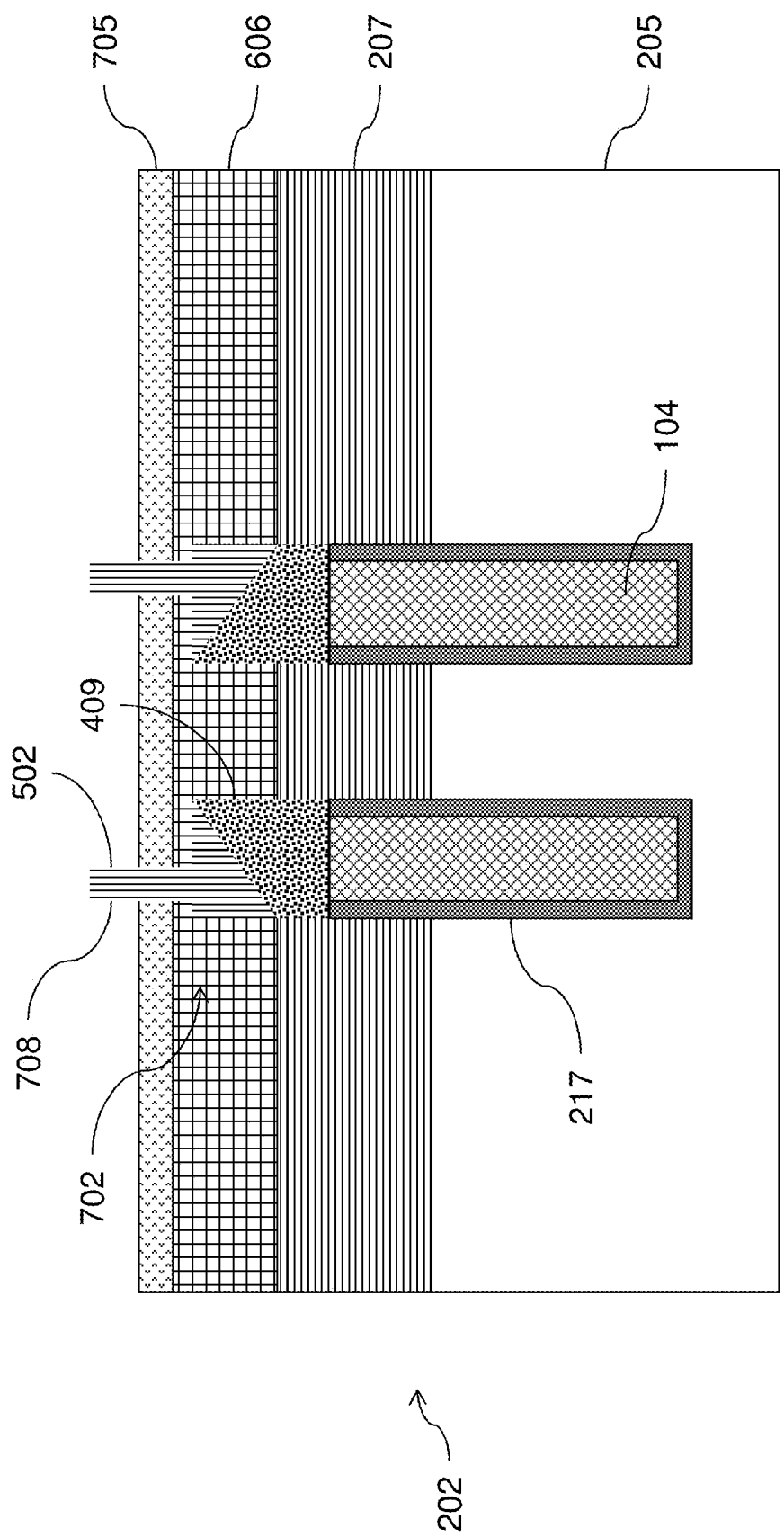

In FIG. 7, a gate stack 702 is formed by depositing one or more dielectric materials, such as silicon dioxide, hafnium silicates, or Hafnium oxides, etc. (not shown), then a conductor layer 705 on the top surface of the first insulator layer 606. The conductor layer 705 is planarized and etched back to expose a second portion 708 of the fins 502. Note: the second portion 708 of the fins 502 is smaller than the first portion 609 of the fins 502. As described below, a portion of the conductor layer 705 will be used as the gate portion of a transistor.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, or a metal silicide, any alloys of such metals, and may be deposited using physical vapor deposition, chemical vapor deposition, or any other technique known in the art.

Figure 8:
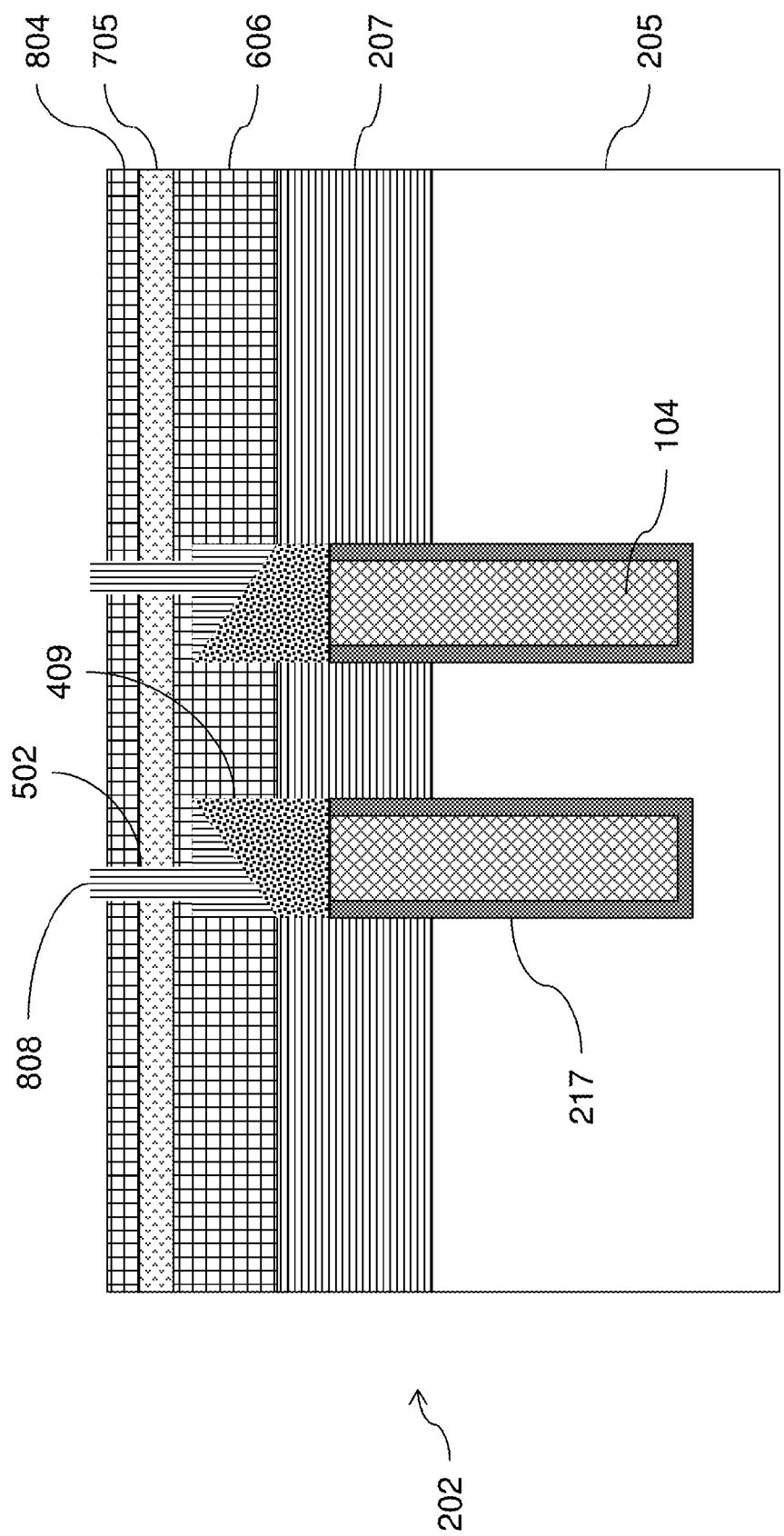

In FIG. 8, a second insulator layer 804 is deposited on the top surface of the conductor layer 705. The second insulator layer 804 may be the same material as the first insulator layer 606. The second insulator layer 804 is planarized and etched back to expose the ends 808 of the fins 502.

Figure 9:
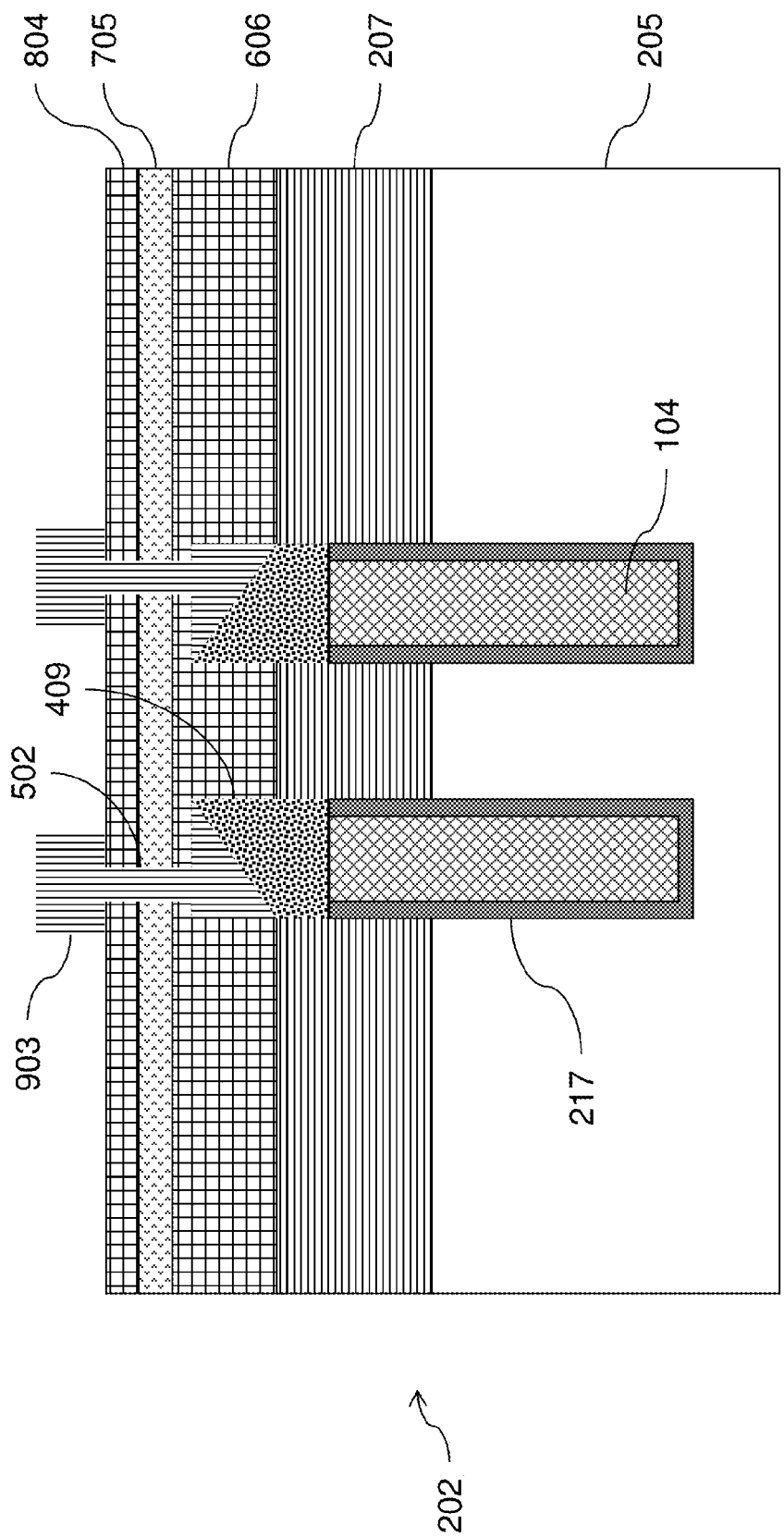

In FIG. 9, nodes 903 are formed on the ends 808 of the fins 502. The nodes 903 may be formed by growing doped silicon epitaxially on the ends 808 of the fins 502 that remain exposed.

Epitaxial growth according to systems and methods herein may be performed via selective epitaxy. Selective epitaxial growth (SEG) of the nodes 903 may occur by mixing gases including: a gas containing a p-type impurity, such as di-borane ($B_2H_6$) or another boron (B)-containing gas; a silicon (Si)-containing gas, for example, one of silane ($SiH_4$) and disilane ($Si_2H_6$); and a germanium (Ge)-containing gas, for example, one of germane ($GeH_4$) and digermane ($Ge_2H_6$). The SEG process is usually performed at a sub-atmospheric process pressure (e.g., 40 torr) and typically with a substrate temperature between about 400° C. and about 750° C. The growth temperature may be at the lower end of the range if the film is grown with more Ge content. The film is grown over exposed single-crystal Si or poly Si surfaces, but not on dielectric films such as oxide or nitride. The nodes 903 mainly form source/drain portions of a transistor, which may be electrically connected to the gate.

Figure 10:
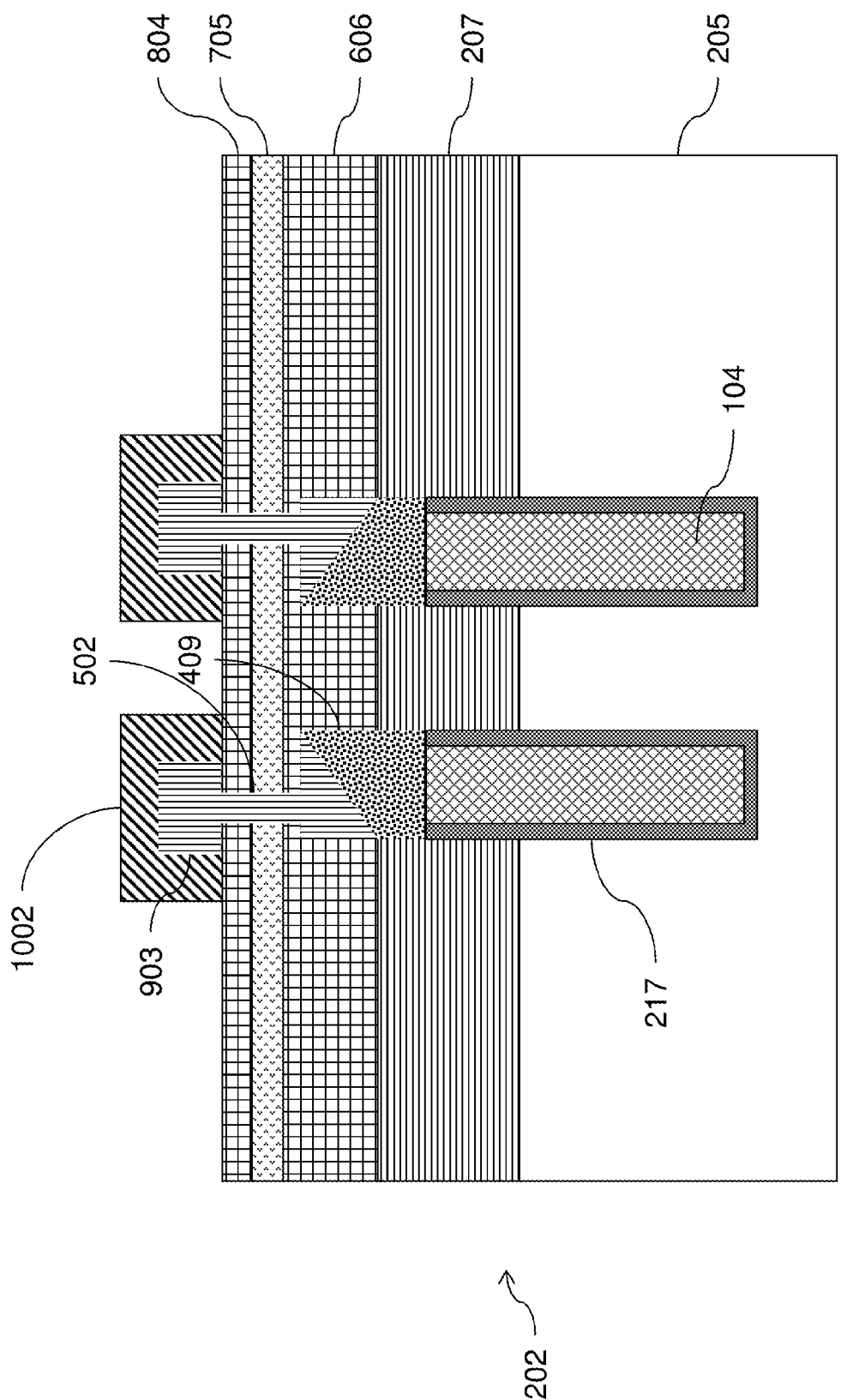

FIG. 10 illustrates a mask 1002 patterned and applied to the top surface of the second insulator layer 804. The mask 1002 protects portions of the structure while using a material removal process.

A hardmask can be formed of any suitable material, whether now known or developed in the future, such as a metal or organic or inorganic ($Si_3N_4$, SiC, $SiO_2C$ (diamond)) hardmask, that has etch resistance greater than the substrate and insulator materials used in the remainder of the structure.

Figure 11:
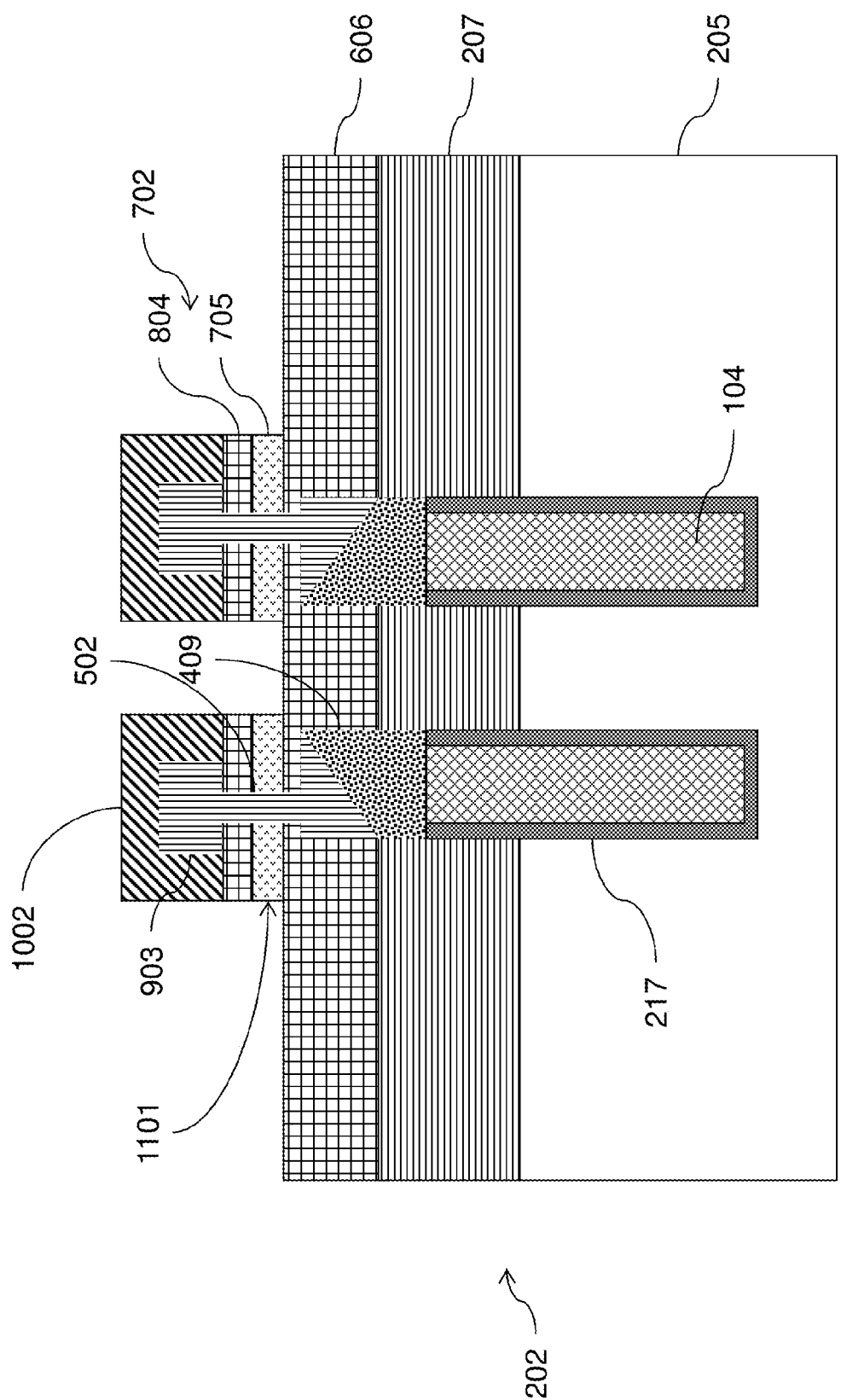

In FIG. 11, a gate 1101 is formed from the gate stack 702 by planarizing and etching the unmasked portions of the second insulator layer 804 and conductor layer 705. The gate 1101 represents the word-lines of the DRAM.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

The gate stack, generally indicated by reference numeral 702, may be patterned using photolithography and subtractive etching processes to define the gate 1101. To that end, the gate 1101 comprising part of the conductor layer 705 and the second insulator layer 804 is masked with the patterned mask 1002. The mask layer may be a photoresist layer comprised of a sacrificial organic material applied to the top surface of the second insulator layer 804 by spin coating or other appropriate means. The photolithography process entails exposing the photoresist layer to radiation imaged through a photomask and developing the resultant latent feature pattern in the exposed resist to define residual areas of photoresist that mask portions of the second insulator layer 804. A subtractive etching process, such as a reactive-ion etching (RIE) process or a wet chemical etching process, can be used to remove regions of the conductor layer 705 not protected by the mask layer. At the conclusion of the subtractive etching process, the top surface of the first insulator layer 606 is exposed aside from the portion covered by the mask 1002. The gate stack 702 can be formed by any appropriate means, such as by photolithography to apply a pattern and etching the various layer materials, for example using etching processes that customarily form polysilicon conductors in integrated circuit structures.

Figure 12:
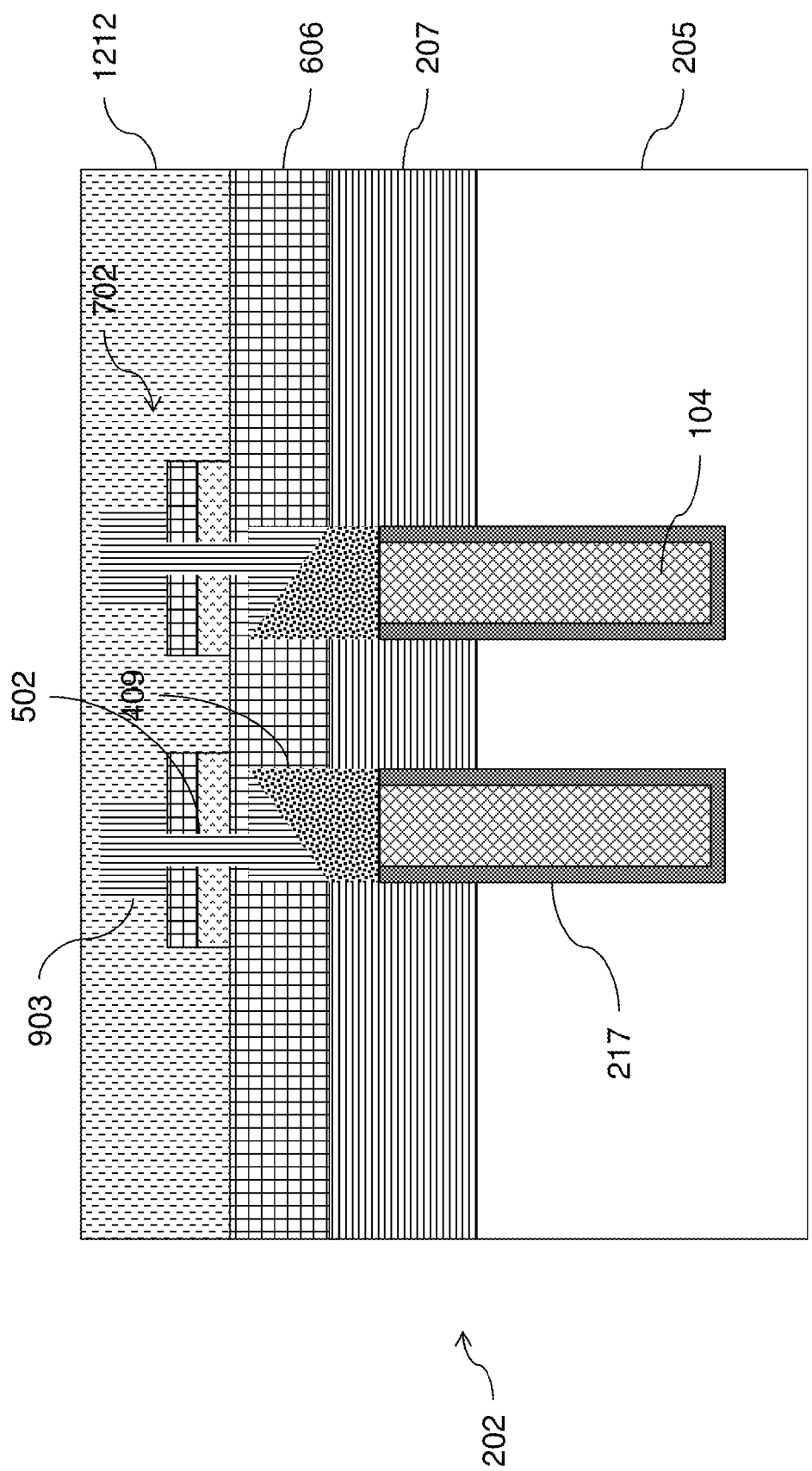

In FIG. 12, the mask 1002 is stripped away and an oxide layer 1212 is deposited over the gate stack 702 and exposed portions of the first insulator layer 606. The oxide layer 1212 may be applied using a plasma enhanced chemical vapor deposition (PECVD) process with a high hydrofluoric acid (HF) removal rate. As is known in the art, different oxide types etch differently. PECVD oxide usually etches faster in HF than other oxides, such as thermal oxides. Other methods may be used.

In FIG. 12, the oxide layer 1212 may be cleaned and polished using a CMP (chemical-mechanical polishing) process. The CMP process combines abrasion and dissolution to remove excess material from the top surface of the oxide layer 1212. The details regarding low-k dielectrics used within semiconductor structures, pre-clean operations, CMP processing, etc. are discussed in U.S. Patent Publication 2007/0249156, which is incorporated herein by reference, and the details of such operations are not set forth herein.

Figure 13:
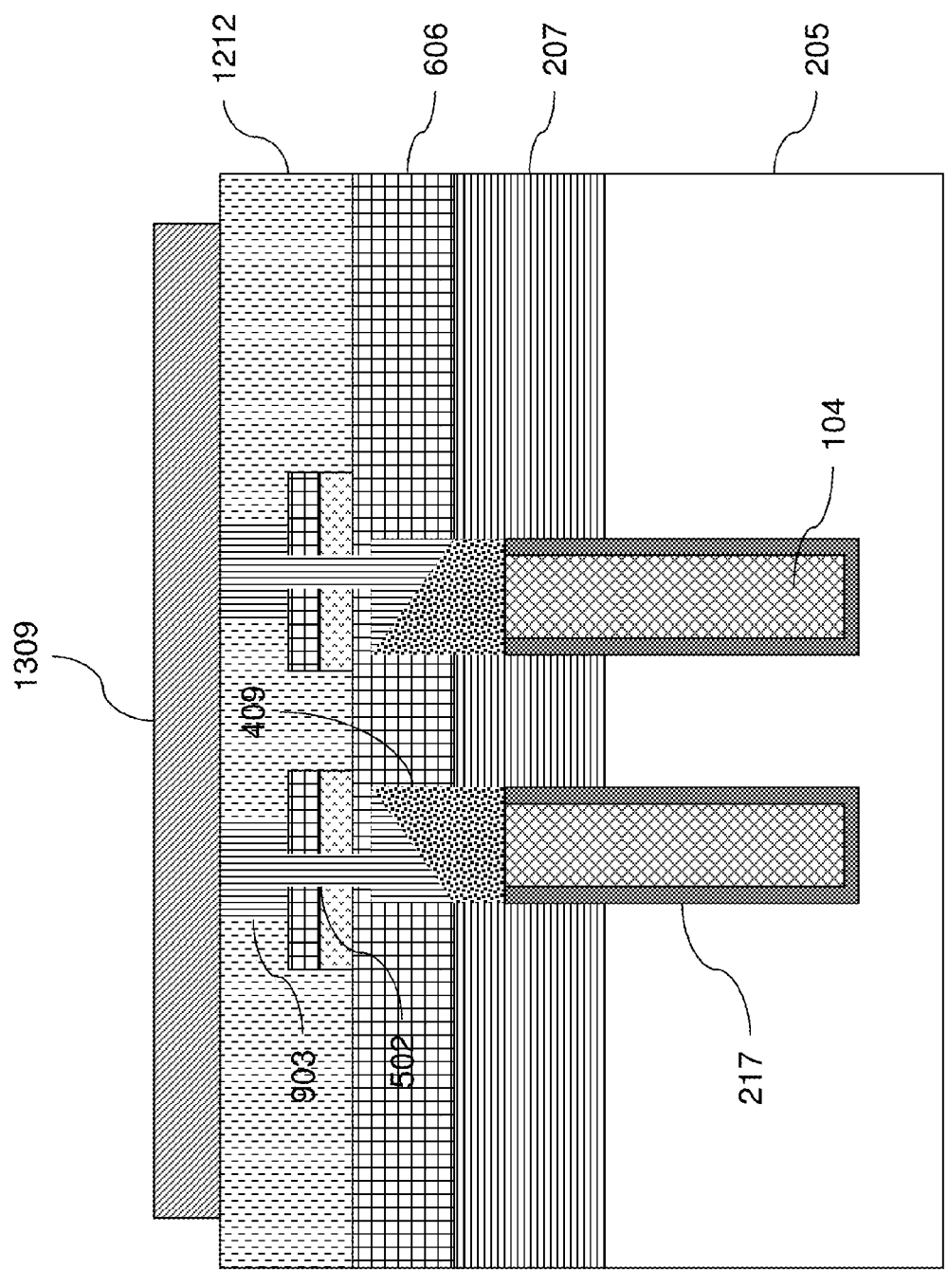

In FIG. 13, the oxide layer 1212 may be reduced. For example, such an oxide reduction process can comprise reactive ion etch (RIE), using an etch that is selective to oxide (with an oxide to nitride etch ratio of, for example, 20:1), and to expose the surface of the nodes 903. A conductor 1309 is formed on the oxide layer 1212, overlaying the exposed surface of the nodes 903. The conductor 1309 represents the bit-lines of the DRAM.

Figure 14:
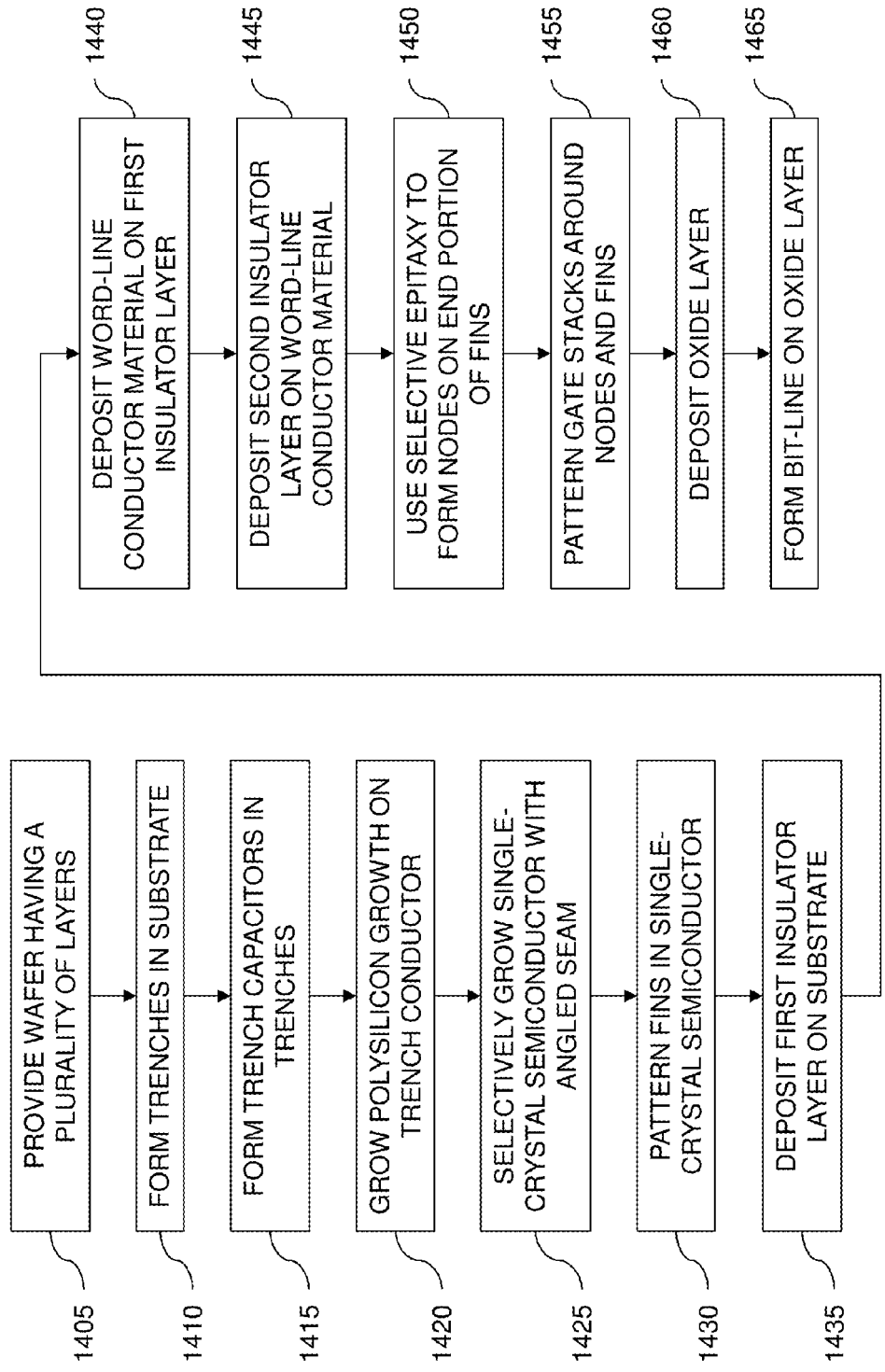
FIG. 14 is a flow diagram illustrating systems and methods herein.

FIG. 14 illustrates a logic flowchart for a method of forming a semiconductor device. At 1405, a wafer having a plurality of layers is provided. At 1410, trenches are formed in a substrate. The substrate comprises a silicon layer, a buried oxide (BOX) layer, and a silicon on oxide (SOI) layer. At 1415, trench capacitors are formed in the trenches. The trench capacitors comprise a trench conductor extending into the BOX layer. A polysilicon growth is formed on the trench conductor, at 1420. The polysilicon growth is formed in upper portions of the trenches. At 1425, a single-crystal semiconductor is selectively grown from an exposed edge of the SOI layer, forming an angled seam between the polysilicon growth and the single-crystal semiconductor. At 1430, fins are patterned in the single-crystal semiconductor. The patterning removes the SOI layer. At 1435, a first insulator layer is deposited on the substrate exposing a first portion of the fins. Word-line conductor material is deposited on the first insulator layer, at 1440. A second portion of the fins is left exposed by the word-line conductor material. The second portion is relatively smaller than the first portion. At 1445, a second insulator layer is deposited on the word-line conductor material leaving an end portion of the fins exposed. At 1450, a selective epitaxial growth process is performed to form nodes on the end portion of the fins. At 1455, gate stacks are patterned around the nodes and fins. The gate stacks comprise the word-line conductor material. At 1460, an oxide layer is deposited on exposed portions of the first insulator layer leaving a surface of the nodes exposed. At 1465, a bit-line is formed on the oxide layer. The bit-line contacts the nodes.

An exemplary method of forming a structure comprising a multi-layer wafer is disclosed. Trenches are formed in the structure and lower portions of the trenches are filled with conductive material. A portion of layers between the trenches is removed leaving exposed edges in the multi-layer wafer. A polysilicon growth is formed on the conductive material, in upper portions of the trenches. A single-crystal semiconductor is created using a selective silicon growth process from the exposed edges. The selective silicon growth process forms an angled seam separating a portion of the polysilicon growth and the exposed edges of the trenches. Fins are formed in the single-crystal semiconductor. Gate stacks are formed around the fins. The gate stacks comprise word-line conductor material. Nodes are formed on the fins. An oxide layer is deposited on the multi-layer wafer leaving a surface of the nodes exposed. A bit-line is formed on the oxide layer, contacting the nodes.

With its unique and novel features, the systems and methods herein teach a semiconductor device structure that includes a trench capacitor comprising deep trenches formed in an n+ type substrate. The deep trenches have a lower portion partially filled with a trench conductor surrounded by a storage dielectric. A polysilicon growth is formed in an upper portion of the deep trenches. The semiconductor device includes a single-crystal semiconductor having an angled seam separating a portion of the polysilicon growth from an exposed edge of the deep trenches. A word-line is wrapped around the single-crystal semiconductor. A bit-line overlays the single-crystal semiconductor.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 15:
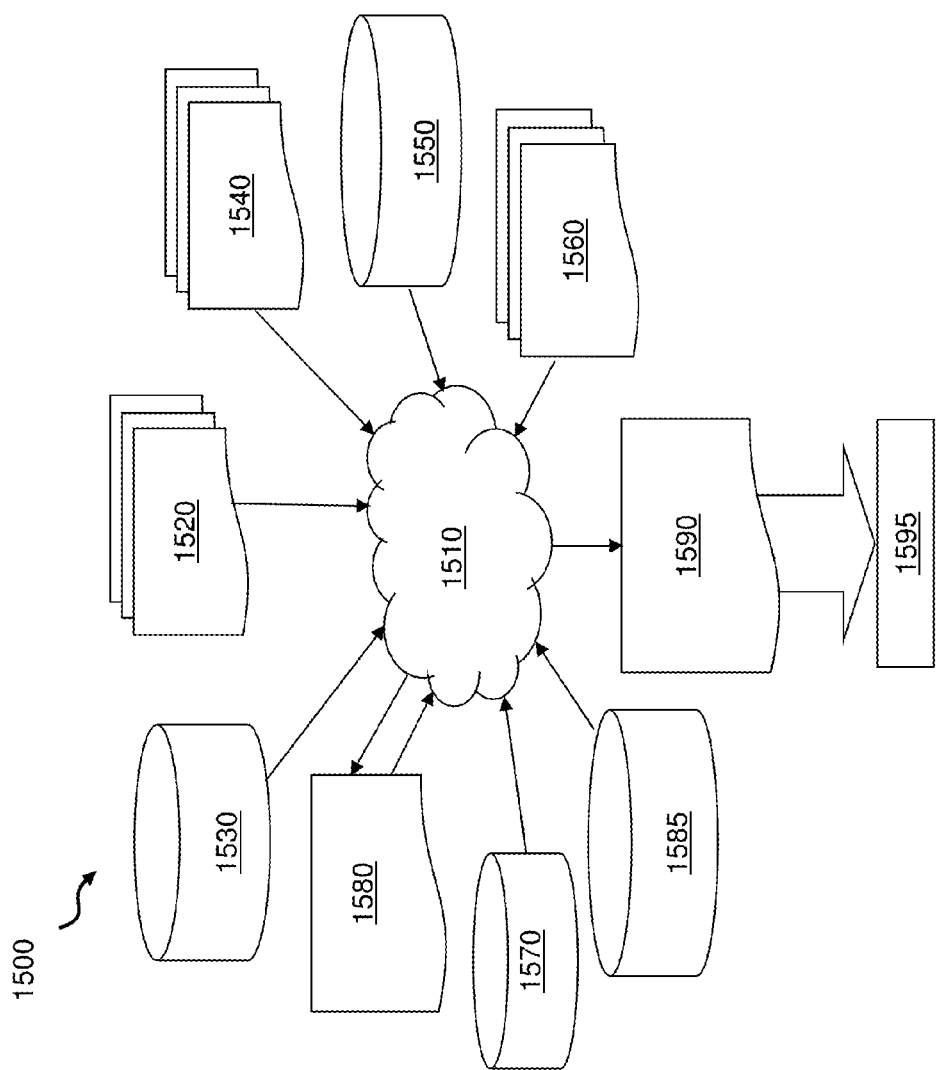
FIG. 15 is a block diagram illustrating an exemplary design flow used, for example, in the logic design, simulation, test, layout, and manufacture of the structures disclosed herein.

FIG. 15 shows a block diagram of an exemplary design flow 1500 used for example, in semiconductor IC logic design, simulation, test, layout, and manufacture. Design flow 1500 includes processes, machines, and/or mechanisms for processing design structures or devices to generate logically or otherwise functionally equivalent representations of the design structures and/or devices described above and shown in FIGS. 1a, 1b, and 2-13. The design structures processed and/or generated by design flow 1500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1500 may vary depending on the type of representation being designed. For example, a design flow 1500 for building an application specific integrated circuit (ASIC) may differ from a design flow 1500 for designing a standard component or from a design flow 1500 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1520 that is preferably processed by a design process 1510. Design structure 1520 may be a logical simulation design structure generated and processed by design process 1510 to produce a logically equivalent functional representation of a hardware device. Design structure 1520 may also or alternatively comprise data and/or program instructions that when processed by design process 1510, generate a functional representation of the physical structure of a hardware device. Whether representing functional and/or structural design features, design structure 1520 may be generated using electronic computer-aided design (ECAD) such as implemented by a core developer/designer. When encoded on a machine-readable data transmission, gate array, or storage medium, design structure 1520 may be accessed and processed by one or more hardware and/or software modules within design process 1510 to simulate or otherwise functionally represent an electronic component, circuit, electronic or logic module, apparatus, device, or system such as those shown in FIGS. 1*a*, 1*b* and 2-13. As such, design structure 1520 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1510 preferably employs and incorporates hardware and/or software modules for synthesizing, translating, or otherwise processing a design/simulation functional equivalent of the components, circuits, devices, or logic structures shown in FIGS. 1-2 and 5 to generate a Netlist 1580 which may contain design structures such as design structure 1520. Netlist 1580 may comprise, for example, compiled or otherwise processed data structures representing a list of wires, discrete components, logic gates, control circuits, I/O devices, models, etc. that describes the connections to other elements and circuits in an integrated circuit design. Netlist 1580 may be synthesized using an iterative process in which Netlist 1580 is resynthesized one or more times depending on design specifications and parameters for the device. As with other design structure types described herein, Netlist 1580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1510 may include hardware and software modules for processing a variety of input data structure types including Netlist 1580. Such data structure types may reside, for example, within library elements 1530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1540, characterization data 1550, verification data 1560, design rules 1570, and test data files 1585 which may include input test patterns, output test results, and other testing information. Design process 1510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1510 without deviating from the scope and spirit of the invention. Design process 1510 may also include modules for performing standard circuit design processes such as timing analysis, verification, design rule checking, place and route operations, etc.

Design process 1510 employs and incorporates logic and physical design tools such as HDL compilers and simulation model build tools to process design structure 1520 together with some or all of the depicted supporting data structures along with any additional mechanical design or data (if applicable), to generate a second design structure 1590. Design structure 1590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1520, design structure 1590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1*a*, 1*b* and 2-13. In one embodiment, design structure 1590 may comprise a compiled, executable HDL simulation model that functionally simulates the devices shown in FIGS. 1*a*, 1*b*, and 2-13.

Design structure 1590 may also employ a data format used for the exchange of layout data of integrated circuits and/or symbolic data format (e.g. information stored in a GDSII (GDS2), GL1, OASIS, map files, or any other suitable format for storing such design data structures). Design structure 1590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1*a*, 1*b*, and 2-13. Design structure 1590 may then proceed to a stage 1595 where, for example, design structure 1590: proceeds to tape-out, is released to manufacturing, is released to a mask house, is sent to another design house, is sent back to the customer, etc.

Aspects of the present disclosure are described herein with reference to flowchart illustrations and/or block diagrams of methods, apparatus (systems), and computer program products according to systems and methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 16:
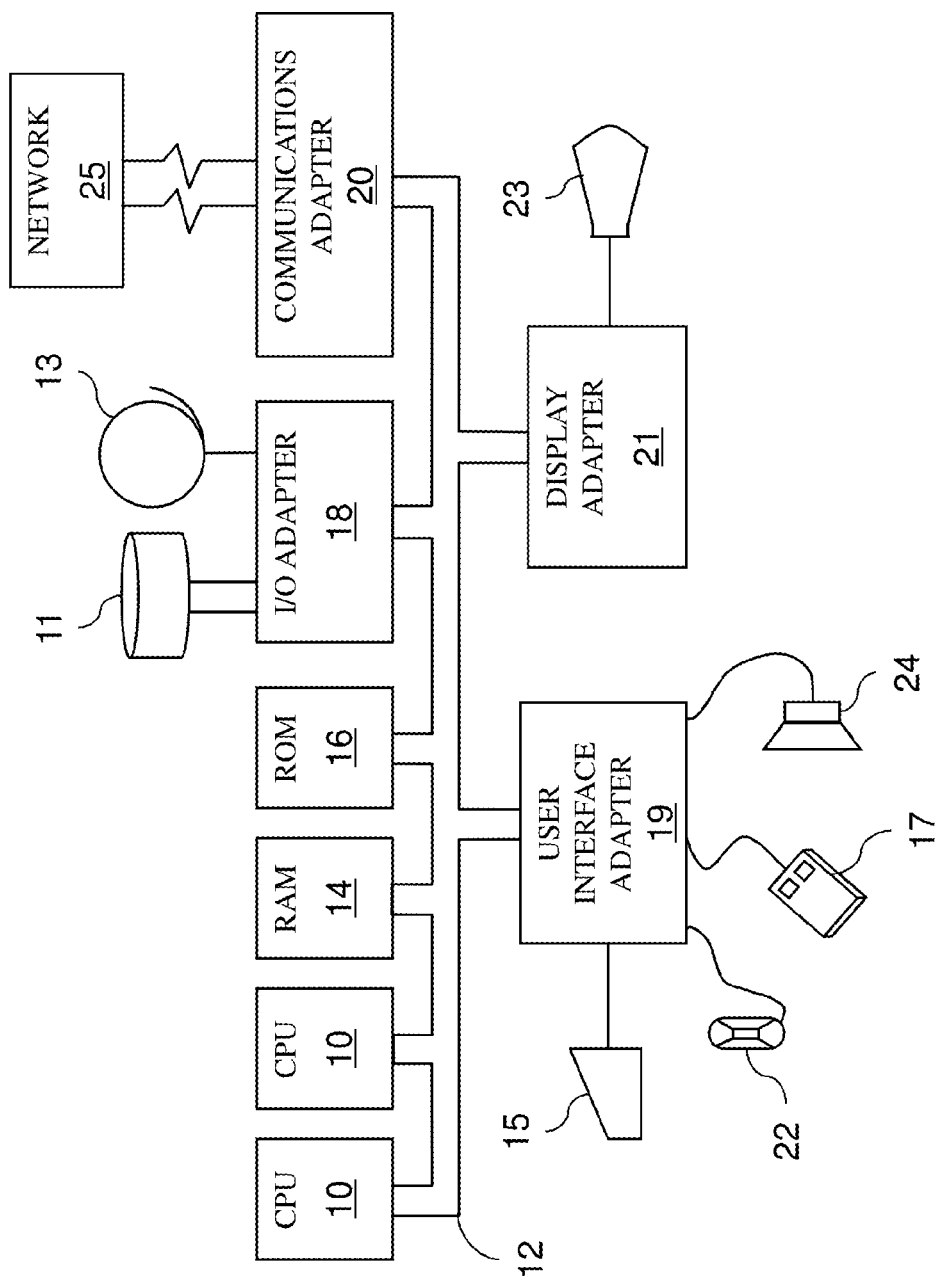
FIG. 16 is a schematic diagram illustrating an exemplary hardware system that can be used in the implementation of the design flow of FIG. 15 according to systems and methods herein.

A representative hardware environment for implementing the systems and methods herein is depicted in FIG. 16. This schematic drawing illustrates a hardware configuration of an information handling/computer system in accordance with the systems and methods herein. The system comprises at least one processor or central processing unit (CPU) 10. The CPUs 10 are interconnected via system bus 12 to various devices such as a Random Access Memory (RAM) 14, Read Only Memory (ROM) 16, and an Input/Output (I/O) adapter 18. The I/O adapter 18 can connect to peripheral devices, such as disk units 11 and tape drives 13, or other program storage devices that are readable by the system. The system can read the instructions on the program storage devices and follow these instructions to execute the methodology of the systems and methods herein.

In FIG. 16, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 including a network interface card such as a LAN card, a modem, or the like connects the bus 12 to a data processing network 25. The communication adapter 20 performs communication processing via a network such as the Internet. A display adapter 21 connects the bus 12 to a display device 23, which may be embodied as an output device such as a monitor (such as a Cathode Ray Tube (CRT), a Liquid Crystal Display (LCD), or the like), printer, or transmitter, for example.

The flowchart and block diagrams in the Figures illustrate the architecture, functionality, and operation of possible implementations of systems, methods, and computer program products according to various examples disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that the terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises," "comprising," and/or "including," when used in this specification, specify the presence of stated features, integers, steps, operations, elements, and/or components, but do not preclude the presence or addition of one or more other features, integers, steps, operations, elements, components, and/or groups thereof.

Furthermore, as used herein, terms such as "right", "left", "vertical", "horizontal", "top", "bottom", "upper", "lower", "under", "below", "underlying", "over", "overlying", "parallel", "perpendicular", etc., are understood to be relative locations as they are oriented and illustrated in the drawings (unless otherwise indicated). Terms such as "touching", "on", "in direct contact", "abutting", "directly adjacent to", etc., are intended to indicate that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various examples of the present disclosure have been presented for purposes of illustration, but are not intended to be exhaustive or limited to the systems and methods disclosed. Many modifications and variations will be apparent to those of ordinary skill in the art without departing from the scope and spirit of the described examples. The terminology used herein was chosen to best explain the principles of the disclosed systems and methods, the practical application or technical improvement over technologies found in the marketplace, or to enable others of ordinary skill in the art to understand the systems and methods disclosed herein.

What is claimed is:

1. A semiconductor device comprising:
    a trench capacitor comprising deep trenches formed in a n+ type substrate, said deep trenches having a lower portion partially filled with a trench conductor surrounded by a storage dielectric;
    a polysilicon growth formed in an upper portion of said deep trenches;
    a single-crystal semiconductor having a seam separating a portion of said polysilicon growth from an exposed edge of said deep trenches, said seam being at an acute angle from said exposed edge;
    a word-line wrapped around said single-crystal semiconductor; and
    a bit-line overlaying said single-crystal semiconductor.

2. The semiconductor device according to claim 1, further comprising:
    a buried oxide (BOX) layer, and
    a silicon on oxide (SOI) layer,
        said trench conductor extending into said BOX layer.

3. The semiconductor device according to claim 2, said seam separating a portion of said polysilicon growth and an exposed edge of said SOI layer.

4. The semiconductor device according to claim 2, said single-crystal semiconductor being selectively grown from said SOI layer.

5. The semiconductor device according to claim 1, further comprising:
    fins formed in said single-crystal semiconductor; and
    nodes comprising doped silicon epitaxially grown on exposed ends of said fins,
        said bit-line contacting said nodes.

6. The semiconductor device according to claim 1, further comprising at least one oxide layer between said word-line and said bit-line.

7. The semiconductor device according to claim 1, further comprising:
   a gate stack comprising:
      said word-line;
      an insulator layer; and
      a doped silicon node contacting said bit-line.

8. A semiconductor device comprising:
   a substrate comprising:
      a silicon layer,
      a buried oxide (BOX) layer, and
      a silicon on oxide (SOI) layer, said BOX layer being between said silicon layer and said SOI layer;
   a trench capacitor comprising deep trenches through said BOX layer and said SOI layer and partially into said silicon layer, said deep trenches having a lower portion partially filled with a trench conductor surrounded by a storage dielectric, said trench conductor extending into said BOX layer;
   a polysilicon growth extending from said trench conductor in an upper portion of said deep trenches;
   a single-crystal semiconductor extending from an exposed edge of said SOI layer; and
   a seam separating a portion of said polysilicon growth from said exposed edge of said SOI layer.

9. The semiconductor device according to claim 8, said seam being at an acute angle from said exposed edge.

10. The semiconductor device according to claim 8, further comprising:
    fins formed in said single-crystal semiconductor.

11. The semiconductor device according to claim 10, further comprising:
    nodes comprising doped silicon epitaxially grown on exposed ends of said fins.

12. The semiconductor device according to claim 11, further comprising:
    a bit-line contacting said nodes.

13. The semiconductor device according to claim 12, further comprising:
    a word-line wrapped around said single-crystal semiconductor.

14. The semiconductor device according to claim 13, further comprising an oxide layer between said word-line and said bit-line.

* * * * *